US008761327B2

(12) United States Patent  
Brouillette

(10) Patent No.: US 8,761,327 B2  
(45) Date of Patent: Jun. 24, 2014

(54) RATIONAL CLOCK DIVIDER FOR MEDIA TIMESTAMPS AND CLOCK RECOVERY FUNCTIONS

(75) Inventor: Pat Brouillette, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 269 days.

(21) Appl. No.: 13/159,649

(22) Filed: Jun. 14, 2011

(65) Prior Publication Data

US 2012/0320268 A1   Dec. 20, 2012

(51) Int. Cl.  
*H04L 7/04* (2006.01)

(52) U.S. Cl.  
USPC ...... 375/362; 375/354; 375/350; 375/240.28; 327/105; 327/199; 327/156; 713/400

(58) Field of Classification Search  
CPC .................................. H04L 12/66; H04N 5/06  
USPC ............... 375/362, 354, 350, 240.28, E7.279; 332/106, 115; 708/277; 327/105, 199, 327/156; 713/400  
See application file for complete search history.

(56) References Cited

U.S. PATENT DOCUMENTS

| | | | | |
|---|---|---|---|---|
| 5,828,678 | A * | 10/1998 | Mock | 714/815 |
| 7,088,398 | B1 | 8/2006 | Wolf et al. | |
| 7,801,263 | B2 | 9/2010 | Haimzon | |
| 2002/0141451 | A1* | 10/2002 | Gates et al. | 370/503 |
| 2003/0056136 | A1* | 3/2003 | Aweya et al. | 713/400 |
| 2003/0081147 | A1* | 5/2003 | Zimmermann | 348/500 |
| 2008/0022143 | A1 | 1/2008 | Scouten et al. | |
| 2008/0191749 | A1* | 8/2008 | Haimzon | 327/105 |
| 2008/0224735 | A1 | 9/2008 | Do et al. | |
| 2008/0298532 | A1 | 12/2008 | Wang | |
| 2009/0167366 | A1* | 7/2009 | Wang | 327/105 |
| 2009/0232262 | A1* | 9/2009 | Ku et al. | 375/355 |
| 2010/0020829 | A1 | 1/2010 | Ruffini | |
| 2010/0238917 | A1* | 9/2010 | Silverman et al. | 370/350 |
| 2011/0267116 | A1* | 11/2011 | Yang et al. | 327/156 |

FOREIGN PATENT DOCUMENTS

| | | |
|---|---|---|
| KR | 10-1998-0021976 A | 6/1998 |
| WO | 2012/173962 A2 | 12/2012 |

OTHER PUBLICATIONS

International Search Report and Written Opinion received for International Application No. PCT/US2012/042007, mailed on Feb. 13, 2013, 9 Pages.

* cited by examiner

*Primary Examiner* — Sam K Ahn  
*Assistant Examiner* — Fabricio R Murillo Garcia

(57) ABSTRACT

Systems and methods are described including receiving a clock signal, using rational clock divider (RCD) logic to generate a lower frequency clock signal in response to the received clock signal, and using the second clock signal to drive software timer logic and generate media timestamps.

20 Claims, 6 Drawing Sheets

100

RATIONAL CLOCK DIVIDER FOR MEDIA TIMESTAMPS AND CLOCK RECOVERY FUNCTIONS

BACKGROUND

In typical consumer electronics equipment, one or more 27 MHz crystals or voltage controlled crystal oscillators (VCXO) are used to drive audio and video interface Phase Lock Loop (PLL) circuits when undertaking clock recovery and/or media timestamp functions. In this usage, a low frequency signal (27 MHz) is used by the PLL to generate higher frequency signals (pixel clock, audio bit clock, etc.) The PLL's output clock has a permanent rational (M/N) relationship with the input, that is N clocks of 27 MHz always generates M clocks of the output signal. However, PLL circuitry requires considerable die area. Industry has responded with much smaller numerically controlled oscillators (NCOs) which accept a much higher input frequency (above 1 GHz) and generate interface signals directly. But NCOs do not provide the related lower-frequency (27 MHz) clock used by software for the purposes of media timing and clock recovery.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
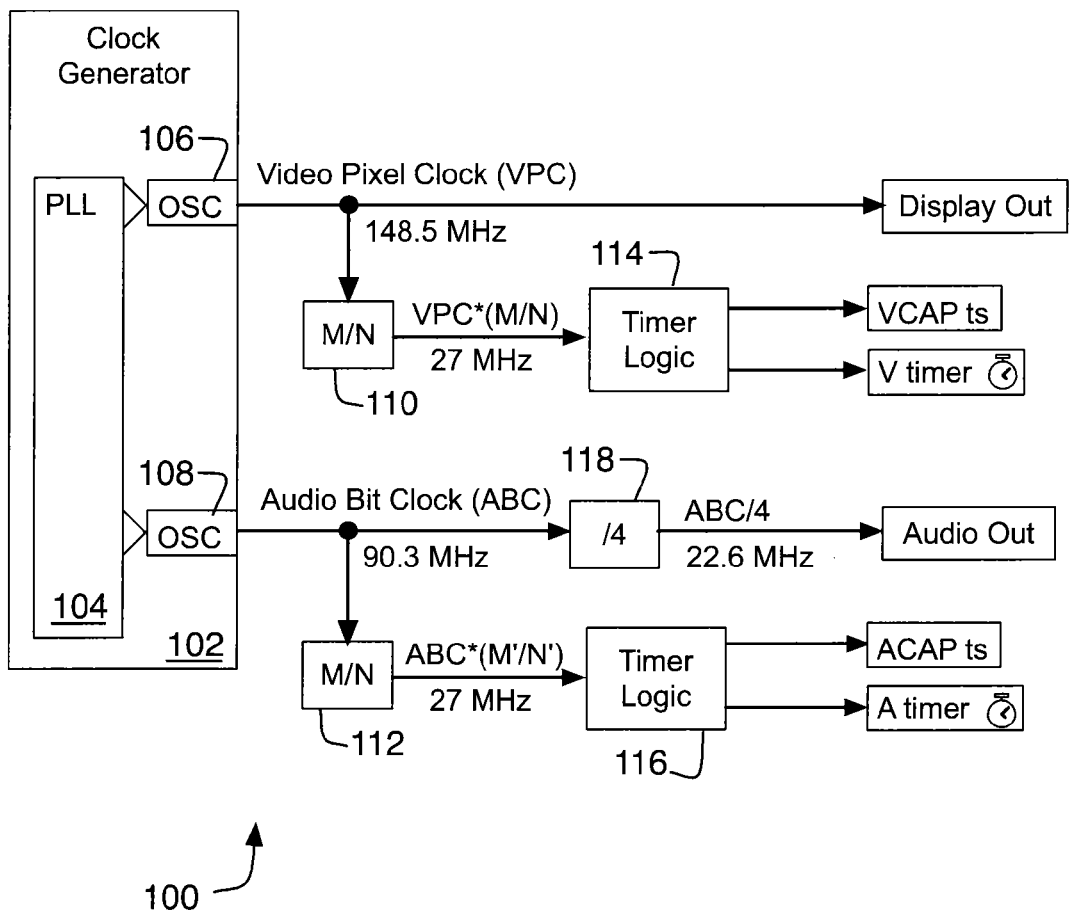
FIG. 1 is an illustrative diagram of an example system.

One or more embodiments are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

While the following description sets forth various implementations that may be manifested in architectures such system-on-a-chip (SoC) architectures for example, implementation of the techniques and/or arrangements described herein are not restricted to particular architectures and/or computing systems and may implemented by any architecture and/or computing system for similar purposes. For instance, various architectures employing, for example, multiple integrated circuit (IC) chips and/or packages, and/or various computing devices and/or consumer electronic (CE) devices such as set top boxes, smart phones, etc., may implement the techniques and/or arrangements described herein. Further, while the following description may set forth numerous specific details such as logic implementations, types and interrelationships of system components, logic partitioning/integration choices, etc., claimed subject matter may be practiced without such specific details. In other instances, some material such as, for example, control structures and full software instruction sequences, may not be shown in detail in order not to obscure the material disclosed herein.

The material disclosed herein may be implemented in hardware, firmware, software, or any combination thereof. The material disclosed herein may also be implemented as instructions stored on a machine-readable medium, which may be read and executed by one or more processors. A machine-readable medium may include any medium and/or mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others.

References in the specification to "one implementation", "an implementation", "an example implementation", etc., indicate that the implementation described may include a particular feature, structure, or characteristic, but every implementation may not necessarily include the particular feature, structure, or characteristic. Moreover, such phrases are not necessarily referring to the same implementation. Further, when a particular feature, structure, or characteristic is described in connection with an implementation, it is submitted that it is within the knowledge of one skilled in the art to affect such feature, structure, or characteristic in connection with other implementations whether or not explicitly described herein.

FIG. 1 illustrates an example system 100 in accordance with the present disclosure. In various implementations, system 100 may be included as at least part of a SoC architecture implemented in a CE system or device. System 100 includes a clock generator module 102 having a phase lock loop (PLL) module 104 as well as two oscillators (OSC) 106 and 108 driven by PLL 104. In various implementations, PLL module 104 may include logic capable of fractional frequency synthesis and/or spread spectrum oscillators may provide OSCs 106 and 108.

In the example of system 100, OSC 106 provides a Video Pixel Clock (VPC) signal having a value of about 148.5 MHz, while OSC 108 provides an Audio Bit Clock (ABC) signal having a value of about 90.3 MHz. When a frequency is described herein as having a value "about" a particular frequency those of skill in the art will recognize that the actual frequency value may reside within a small range of frequency values distributed about the particular value stated. For instance, by way of non-limited example, a signal having a frequency value of about 148.5 MHz may have a frequency value within the range of 148.45 MHz to 148.55 MHz. OSC 106 and OSC 108 may be programmed by SoC software to run faster or slower for the purposes of tracking a media input (broadcast stream, video capture, audio capture, etc.) to provide improved media playback (e.g., minimal dropped or repeated frames or audio samples).

In accordance with the present disclosure and as will be described in further detail below, system 100 includes rational clock division (M/N) modules 110 and 112 that may receive the VPC and ABC clock signals respectively, and that may be configured to generate lower frequency clock signals provided to video timer logic 114 and audio timer logic 116 respectively. As will be described in greater detail below, each of M/N modules 110 and 112 may be provided by processor logic configured to operate as rational clock divider (RCD) logic and may undertake rational clock division operations in response to a higher frequency input clock signal. In various implementations, M/N modules in accordance with present disclosure may generate clock signals that may not substantially drift with respect to the input clock signal. Further, in various implementations, M/N modules in accordance with the present disclosure may not include PLL logic, where PLL logic includes any type of analog and/or digital logic capable of providing variable frequency oscillator and/or phase detector functionality.

In accordance with the present disclosure, M/N modules 110 and 112 may generate lower frequency output clock signals with frequencies having a rational M/N relationship to the input clock frequency where M and N are integers greater than zero and where M is a greater than N. For instance, in the example of system 100, M/N module 110 may generate input for audio timer logic 114 by undertaking algorithms in accordance with the present disclosure using the values of M=11 and N=2 to generate a 27 MHz clock signal from the 148.5 MHz VPC clock signal. Similarly, to generate input for audio timer logic 114, M/N module 112 may implement algorithms in accordance with the present disclosure using the different (M/N) values of M'=6272 and N'=1875 to generate a 27 MHz clock signal from the 90.3 MHz ABC clock signal.

Thus, overall, system 100 may provide at least two clock signals including a Display Out signal corresponding to the VPC signal and an Audio Out signal derived from the ABC signal. System 100 also includes frequency division logic 118 that may divide the frequency of the ABC signal by four to produce the Audio Out signal. For example, logic 118 may divide a 90.3 MHz ABC signal by four to produce a 22.6 MHz Audio Out signal. In addition, as will be explained in greater detail below, system 100 may provide at least two hardware capture timestamp signals including a video capture timestamp signal (VCAP ts) generated by video timer logic 114 and an audio capture timestamp signal (ACAP ts) generated by audio timer logic 116. Further, logic 114 and 116 may provide corresponding media timers (V timer and A timer) for use by software in media timing and clock recovery purposes. In various implementations, video timer logic 114 and/or audio timer logic 116 may be implemented as at least portions of a clock recovery unit (CRU).

Further, those of skill in the art may recognize that the VPC and ABC clock signals may have different frequencies than shown in FIG. 1. For example, the VPC clock signal may have any frequency value including various frequency values in accordance with various video coding and/or data standards or formats. For instance, in the example of system 100, the VPC signal has a value of 148.5 MHz corresponding to a 1080p display clock value as described in, for example, the High-Definition Multimedia Interface (HDMI) Specification Version 1.3, published Jun. 22, 2006 by HDMI Licensing, LLC. In other implementations, the VPC signal may, by way of non-limiting example, have a value of 148.3516 MHz corresponding to the 1080p display clock multiplied by the factor of (1000/1001) as also described in HDMI Specification Version 1.3. Similarly, the ABC signal may have various values, including, but not limited to, 147.456 MHz, 135.4752 MHz, or 98.304 MHz, to name other standard audio bit clock frequencies as also described in HDMI Specification Version 1.3. Again, these are merely representative clock signal frequency examples, and clock signals may have any frequency value in accordance with the present disclosure. Moreover, clock signals in accordance with the present disclosure may have any amplitude, jitter and/or duty cycle.

In addition, while FIG. 1 illustrates system 100 as including clock generator module 102, in various implementations system 100 may not include clock generator module 102. For example, in some implementations, system 100 may receive the VPC and ABC clock signals from another system or device separate or remote from system 100. For instance, system 100 may represent portions of a sink device (as defined in, for example, HDMI Specification Version 1.3), such as a set-top box or the like, where system 100 receives the VPC and ABC clock signals from another system or device over a wired ort wireless communications channel or link such as a WiFi® channel, an HDMI cable or the like.

Figure 2:
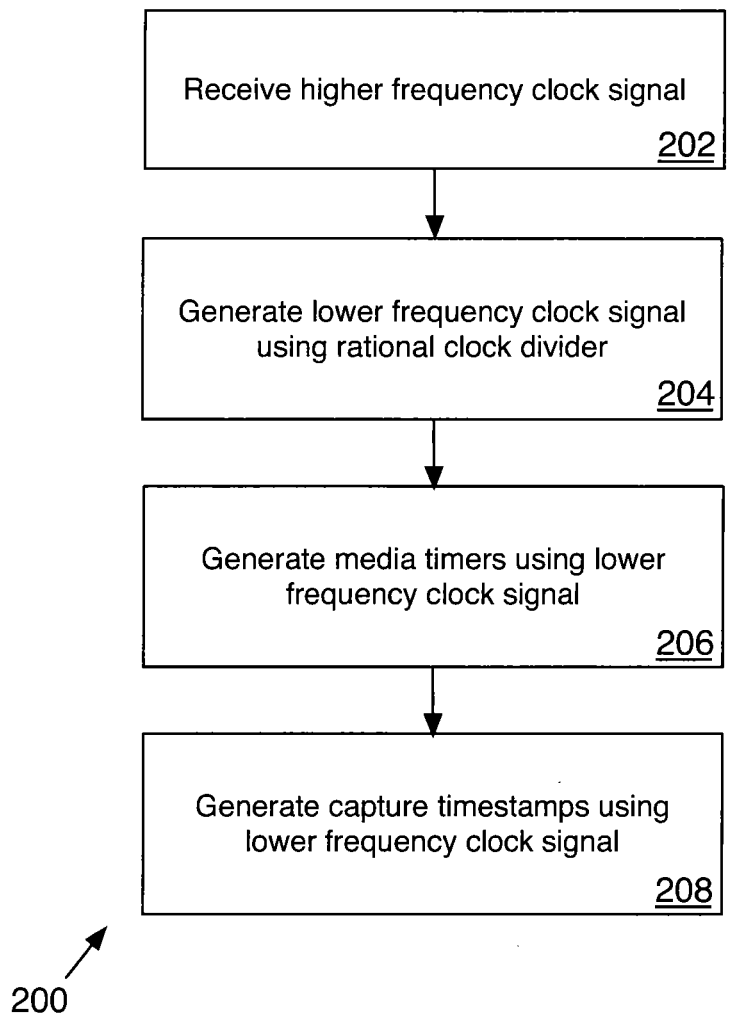
FIG. 2 illustrates an example process.

FIG. 2 illustrates a flow diagram of an example process 200 for undertaking rational clock division according to various implementations of the present disclosure. Process 200 may include one or more operations, functions or actions as illustrated by one or more of blocks 202, 204, 206 and 208 of FIG. 2. By way of non-limiting example, process 200 will be described herein with reference to example system 100 of FIG. 1. Process 200 may begin at block 202.

At block 202, a higher frequency clock signal may be received. For example, block 202 may involve M/N module 110 receiving the 148.5 MHz VPC signal as an input clock signal. At block 204, a lower frequency clock signal may be generated using a rational clock divider and the higher frequency clock signal. For instance, as will be explained in further detail below, block 204 may involve M/N module 110 performing a rational clock division algorithm in accordance with the present disclosure using the values of M=11 and N=2 to generate a 27 MHz clock signal as a lower frequency output clock signal.

Figure 3:
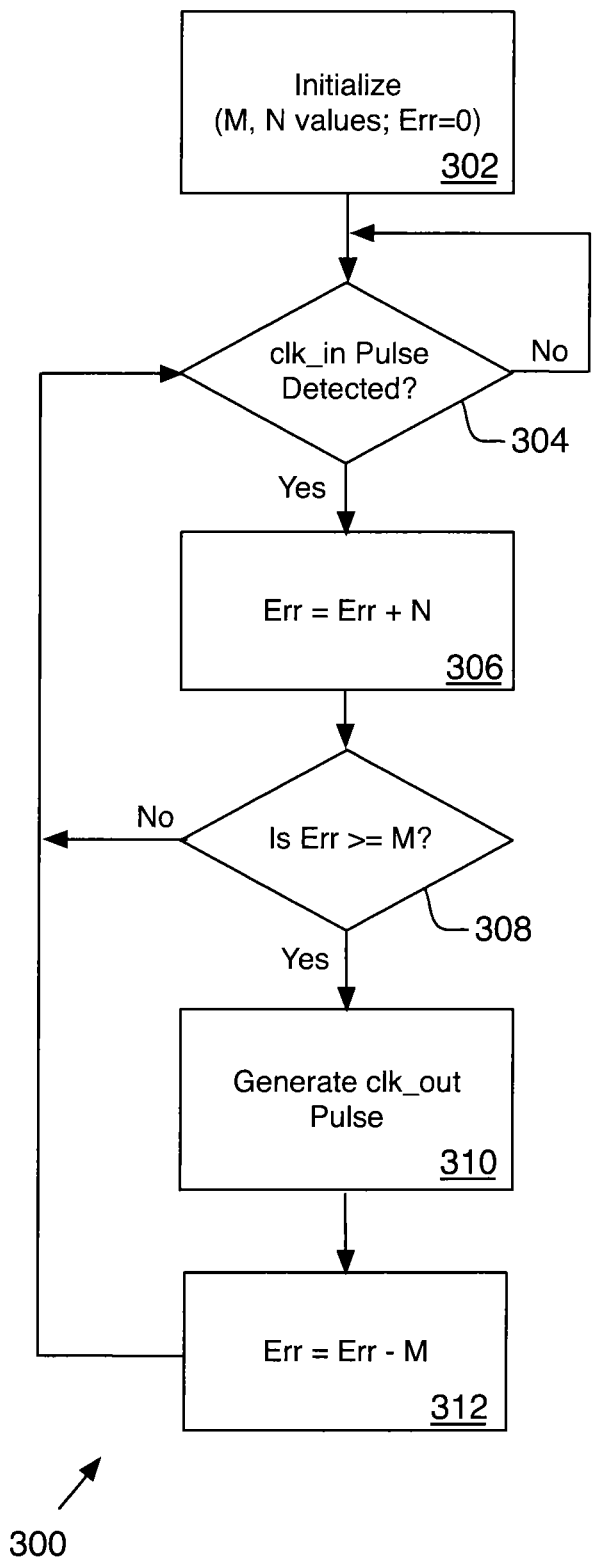
FIG. 3 illustrates an example process.

FIG. 3 illustrates a flow diagram of an example process 300 for implementing rational clock division according to various implementations of the present disclosure. For example, process 300 may be employed in undertaking block 204 of FIG. 2. Process 300 may include one or more operations, functions or actions as illustrated by one or more of blocks 302, 304, 306, 308, 310, and 312. By way of non-limiting example, process 300 will be described herein with reference to example system 100 of FIG. 1. Process 300 may begin at block 302.

At block 302 a rational clock division algorithm may be initialized with integer values set for M and N, and with an integer error value (Err) initially set to zero. For example, as noted above, values of M=11 and N=2 may be set to generate a 27 MHz clock signal from a 148.5 MHz input clock signal. At block 304 the input clock signal (clk_in) may be sampled and, when a pulse of the input clock signal is detected, the error value may be incremented by the value of the denominator N (e.g., Err=Err+N) at block 306. In the example of N=2, the error value may be incremented by two at block 306. At block 308, the newly incremented error value may be compared to the value of the numerator M (e.g., is Err≥M?), and, if the error value is less than the value of M then process 300 may loop back to block 304.

Process 300 may continue to loop through blocks 304-308, incrementing the error value by N at each instance of blocks 306, until the error value is determined to be greater than or equal to the numerator M at block 308. When the error value equals or exceeds the numerator M then an output clock pulse may be generated at block 310 and the error value may be decremented by the value of the numerator M (e.g., Err=Err−M) at block 312. Subsequently, process 300 may continue by looping back to block 304. Continuing the example for M=11 and N=2, after initializing the error value to zero at block 302, process 300 may include six instances of the error value being incremented by N=2 at block 306 until, at a subsequent instance of block 308, the error value of twelve (12) may be found to exceed the value of M=11 and a first pulse of the output clock (clk_out) may be generated at a first instance of block 310.

Overall, N instances of generating output clock pulses at block 310 may be undertaken for every M instances of detecting input clock pulses at block 304. Hence, for the example values of M=11 and N=2, a total of two output clock pulses may be generated at block 310 for every eleven output clock pulses detected at block 304. In other words, successive iterations of process 300 may result, on average, in a lower frequency output clock pulse being generated at block 310 in response to every M/N input clock signal pulses detected at block 304. Hence, for the example values of M=11 and N=2, multiple iterations of process 300 may result, on average, in one output clock pulse being generated for every 5.5 input clock pulses.

Figure 4:
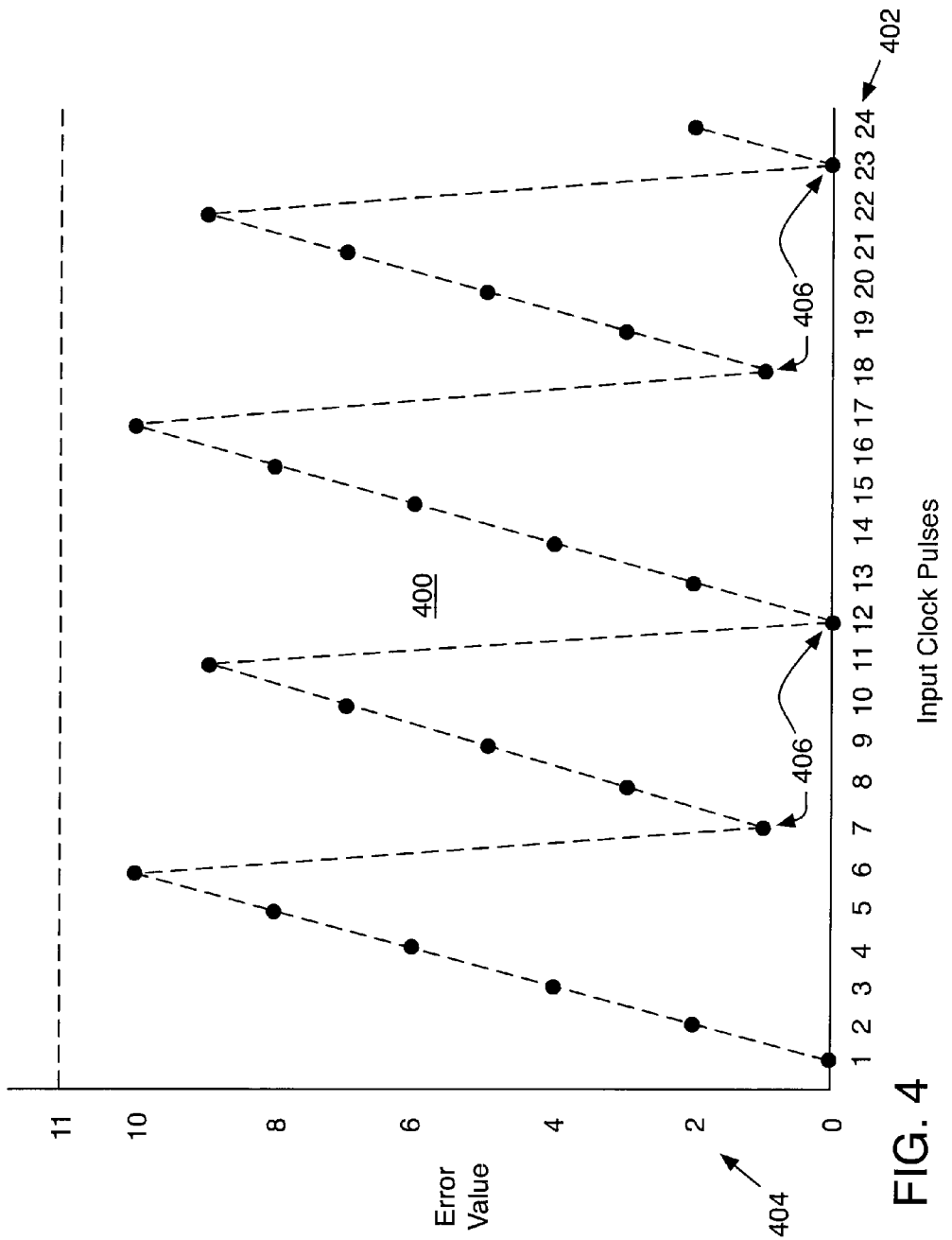
FIG. 4 illustrates an example diagram.

FIG. 4 illustrates an example diagram of a plot 400 of the error value versus input clock pulse number for the case of M=11 and N=2 for multiple iterations of a rational clock division algorithm in accordance with the present disclosure. The horizontal axis of plot 400 illustrates a sequence of input clock pulses 402 of an input clock signal while the vertical axis illustrates the error value 404. Referring to both FIGS. 3 and 4, output clock pulses 406 may be produced when, subsequent to the error value equaling or exceeding the numerator M at block 308, the error value is decremented by M at block 312. For instance, continuing the example from above, pulses 406 of a 27 MHz output clock may be generated in response to the $7^{th}$, $12^{th}$, $18^{th}$ and $23^{rd}$ input pulses of a 148.5 MHz input clock signal.

The following table provides values of M and N in accordance with the present disclosure for generating a 27 MHz output clock signal as a function of different example input clock signal frequencies:

TABLE 1 values of M and N for 27 MHz output

| Input Clock | Input Frequency | M | N |
|---|---|---|---|
| 1080p Display Clock | 148.5 | 11 | 2 |
| Display Clock*(1000/1001) | 148.3516 | 500 | 91 |
| Audio 36.864*4 | 147.456 | 2048 | 375 |
| Audio 33.8688*4 | 135.4752 | 3136 | 625 |
| Audio 24.576*4 | 98.304 | 4096 | 1125 |
| Audio 22.5792*4 | 90.3168 | 6272 | 1875 |

In various implementations, a rational clock division algorithm in accordance with the present disclosure, such as an algorithm corresponding to process 300, may be described in pseudo code as follows:

```
always @ (posedge clk_in) {
    err = err + denominator
    if ( err >= numerator )
        clock_out
        err = err - numerator
}
```

Returning to discussion of FIG. 2, after generating a lower clock frequency signal at block 204 using, for example, process 300, process 200 may conclude with the use of the lower frequency clock signal to generate one or more media timers for software use at block 206 and one or more hardware capture timestamps at block 208. Continuing the example from above, block 206 may include M/N module 110 providing the lower frequency clock signal to video timer logic 114 where, in response, logic 114 may use well-known techniques to generate one or more video timestamps in the form of the signal VCAP ts. Similarly, block 206 may include timer logic 116 using the lower frequency clock signal to generate one or more audio timestamps in the form of the signal ACAP ts. Finally, block 208 may include logic 114 and 116 using well-known techniques to generate respective media timers in the form of signals V timer and A timer.

While the implementation of example processes 200 and 300, as illustrated in FIGS. 2 and 3, may include the undertaking of all blocks shown in the order illustrated, the present disclosure is not limited in this regard and, in various examples, implementation of processes 200 and/or 300 may include the undertaking only a subset of all blocks shown and/or in a different order than illustrated. For example, in various implementations, block 206 and 208 may be undertaken at substantially the same time or block 208 may be undertaken before block 206. Similarly, blocks 310 and 312 of FIG. 3 may be undertaken at substantially the same time or block 312 may be undertaken before block 310.

In addition, any one or more of the processes and/or blocks of FIGS. 2 and 3 may be undertaken in response to instructions provided by one or more computer program products. Such program products may include signal bearing media providing instructions that, when executed by, for example, one or more processor cores, may provide the functionality described herein. The computer program products may be provided in any form of computer readable medium. Thus, for example, a processor including one or more processor core(s) may undertake one or more of the blocks shown in FIGS. 2 and 3 in response to instructions conveyed to the processor by a computer readable medium.

Figure 5:
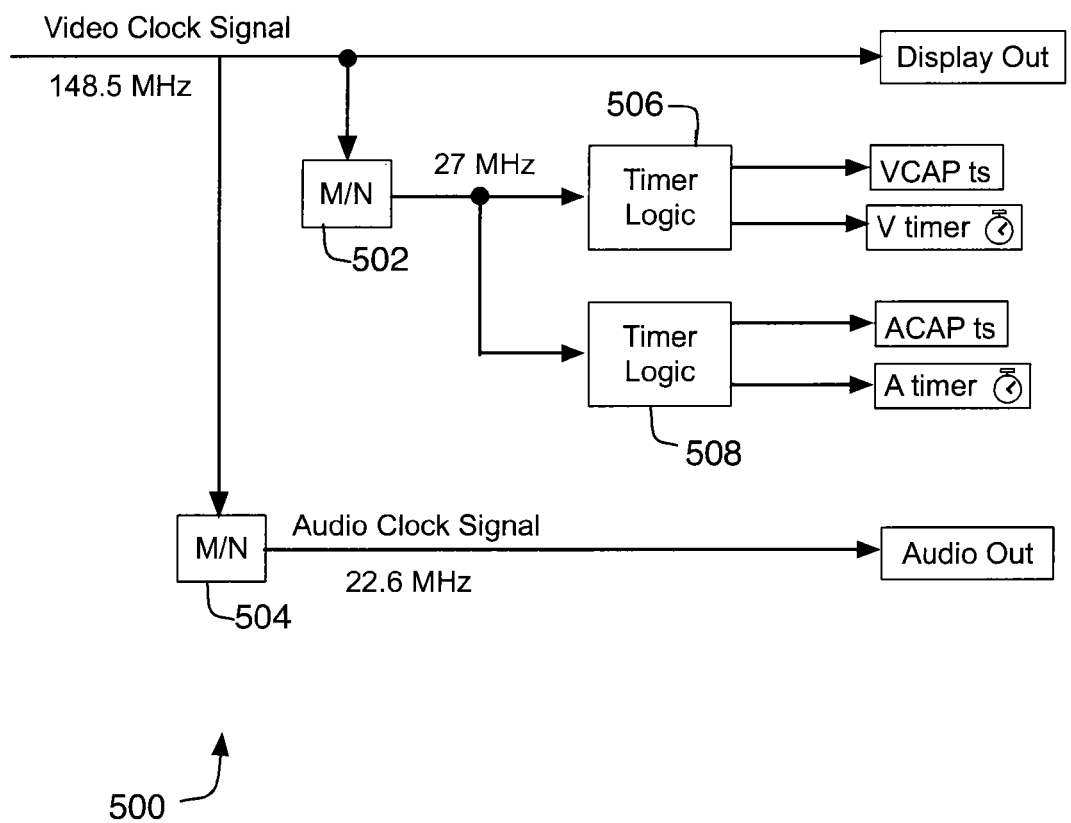
FIG. 5 illustrates an example system.

FIG. 5 illustrates an example system 500 in accordance with the present disclosure. In various implementations, system 500 may be included as at least part of a SoC architecture implemented in a CE system or device. For instance, system 500 may be included in a media sink CE device or system such as an HDMI sink device. System 500 may receive an input clock signal such as a higher frequency clock signal such as a video clock signal from an external source. System 500 includes two M/N modules 502 and 504 that may use the input clock signal to generate lower frequency clock signals as described herein.

In system 500, M/N module 502 may generate a lower frequency clock signal from the input clock signal, while M/N module 504 may generate a different lower frequency clock signal such as an audio clock signal. For instance, the input clock signal may be a 148.5 MHz 1080p VPC signal that M/N module 502 may use to generate a 27 MHz clock signal. The 27 MHz clock signal may be provided to video timer logic 506 and to audio timer logic 508. In addition, M/N module 504 may use the VPC signal to generate a 22.6 MHz signal (e.g., an ABC signal) provided as an Audio Out signal by system 500.

Figure 6:
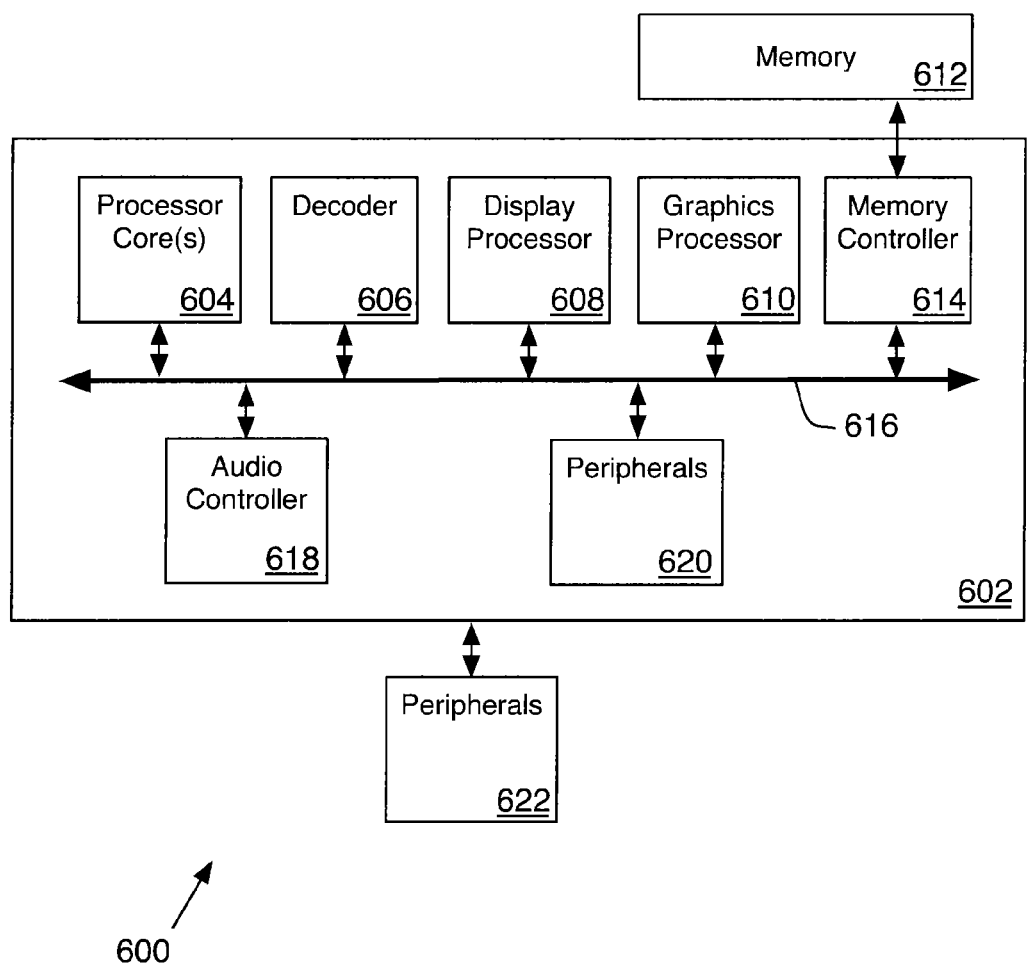
FIG. 6 is an illustrative diagram of an example system, all arranged in accordance with at least some implementations of the present disclosure.

FIG. 6 illustrates an example system 600 in accordance with the present disclosure. System 600 may be used to perform some or all of the various functions discussed herein and may include any device or collection of devices capable of undertaking rational clock division for media timestamp and clock recovery functions in accordance with various implementations of the present disclosure. For example, system 600 may include selected components of a computing platform or device such as a desktop, mobile or tablet computer, a smart phone, a set top box, etc., although the present disclosure is not limited in this regard. In some implementations, system 600 may be a computing platform or SoC based on Intel® architecture (IA) for CE devices. It will be readily appreciated by one of skill in the art that the implementations described herein can be used with alternative processing systems without departure from the scope of the present disclosure.

System 600 includes a processor 602 having one or more processor cores 604. Processor cores 604 may be any type of processor logic capable at least in part of executing software and/or processing data signals. In various examples, processor cores 604 may include CISC processor cores, RISC microprocessor cores, VLIW microprocessor cores, and/or any number of processor cores implementing any combination of instruction sets, or any other processor devices, such as a digital signal processor or microcontroller.

Processor 602 also includes a decoder 606 that may be used for decoding instructions received by, e.g., a display processor 608 and/or a graphics processor 610, into control signals and/or microcode entry points. While illustrated in system 600 as components distinct from core(s) 604, those of skill in the art may recognize that one or more of core(s) 604 may implement decoder 606, display processor 608 and/or graphics processor 610. In some implementations, processor 602 may be configured to undertake any of the processes described herein including the example processes described with respect to FIGS. 2 and 3. Further, in response to control signals and/or microcode entry points, decoder 606, display processor 608 and/or graphics processor 610 may perform corresponding operations.

Processing core(s) 604, decoder 606, display processor 608 and/or graphics processor 610 may be communicatively and/or operably coupled through a system interconnect 616 with each other and/or with various other system devices, which may include but are not limited to, for example, a memory controller 614, an audio controller 618 and/or peripherals 620. Peripherals 620 may include, for example, a unified serial bus (USB) host port, a Peripheral Component Interconnect (PCI) Express port, a Serial Peripheral Interface (SPI) interface, an expansion bus, and/or other peripherals. While FIG. 6 illustrates memory controller 614 as being coupled to decoder 606 and the processors 608 and 610 by interconnect 616, in various implementations, memory controller 614 may be directly coupled to decoder 606, display processor 608 and/or graphics processor 610.

In some implementations, system 600 may communicate with various I/O devices not shown in FIG. 6 via an I/O bus (also not shown). Such I/O devices may include but are not limited to, for example, a universal asynchronous receiver/transmitter (UART) device, a USB device, an I/O expansion interface or other I/O devices. In various implementations, system 600 may represent at least portions of a system for undertaking mobile, network and/or wireless communications.

System 600 may further include memory 612. Memory 612 may be one or more discrete memory components such as a dynamic random access memory (DRAM) device, a static random access memory (SRAM) device, flash memory device, or other memory devices. While FIG. 6 illustrates memory 612 as being external to processor 602, in various implementations, memory 612 may be internal to processor 602. Memory 612 may store instructions and/or data represented by data signals that may be executed by processor 602 in undertaking any of the processes described herein including the example processes described with respect to FIGS. 2 and 3. In some implementations, memory 612 may include a system memory portion and a display memory portion.

The devices and/or systems described herein, such as example systems 100, 500 and/or 600 represent several of many possible device configurations, architectures or systems in accordance with the present disclosure. Numerous variations of systems such as variations of example systems 100, 500 and 600 are possible consistent with the present disclosure. For example, while FIG. 5 illustrates system 500 as including two M/N modules, variations of system 500 may include any number of M/N modules. For instance, systems in accordance with the present disclosure may include only a single M/N module that may be used to generate a lower frequency clock signal from a higher frequency input clock signal.

The systems described above, and the processing performed by them as described herein, may be implemented in hardware, firmware, or software, or any combination thereof. In addition, any one or more features disclosed herein may be implemented in hardware, software, firmware, and combinations thereof, including discrete and integrated circuit logic, application specific integrated circuit (ASIC) logic, and microcontrollers, and may be implemented as part of a domain-specific integrated circuit package, or a combination of integrated circuit packages. The term software, as used herein, refers to a computer program product including a computer readable medium having computer program logic stored therein to cause a computer system to perform one or more features and/or combinations of features disclosed herein.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

What is claimed:

1. A method, comprising:

at a system having a decoder and a processor:

receiving a first clock signal having a first frequency, and outputting the first clock signal from the system in the form of a display out clock signal;

using rational clock divider (RCD) logic at the system to generate a second clock signal in response to the first clock signal, the second clock signal having a second frequency, wherein the second frequency is lower than the first frequency;

generating video media timers using the second clock signal; and generating at least one video capture timestamp in response to the second clock signal, wherein the video media timers and the at least one video capture timestamp are output from the system separately from the output of the first clock signal of the system so that the output of the at least one video capture timestamp and video media timers have a different frequency than the output first clock signal;

receiving a third clock signal having a third frequency;

generating a fourth clock signal having a fourth frequency and in response to the third clock signal, wherein the fourth frequency is lower than the third frequency, and outputting the fourth clock signal from the system in the form of an audio out clock signal;

using RCD logic at the system to generate a fifth clock signal in response to the third clock signal, the fifth clock signal having a fifth frequency, wherein the fifth frequency is lower than the third frequency;

generating audio media timers using the fifth clock signal; and generating at least one audio capture timestamp in response to the fifth clock signal,
   wherein the audio media timers and the at least one audio capture timestamp are output from the system separately from the output of the fourth clock signal of the system so that the output of the at least one audio capture timestamp and audio timers have a different frequency than the output fourth clock signal.

2. The method of claim 1, wherein the second frequency has a value substantially equal to a value of the first frequency divided by a factor (M/N), wherein M and N comprise integers, and wherein M is greater than N.

3. The method of claim 1, wherein using RCD logic to generate the second clock signal in response to the first clock signal comprises generating N pulses of the second clock in response to receiving M pulses of the first clock signal, wherein M and N comprise integers, and wherein M is greater than N.

4. The method of claim 1, wherein using RCD logic to generate the second clock signal in response to the first clock signal comprises:
   incrementing an error value by N in response to a pulse of the first clock signal; and
   generating a pulse of the second clock signal in response to the error value being greater than or equal to M, wherein N and M comprise integers, and wherein N is less than M.

5. The method of claim 4, further comprising:
   decrementing the error value by M in response to generating a pulse of the second clock signal.

6. The method of claim 1, wherein the second clock signal does not substantially drift with respect to the first clock signal.

7. The method of claim 1, wherein using RCD logic to generate the second clock signal in response to the first clock signal does not include using phase lock loop (PLL) logic to generate the second clock signal.

8. The method of claim 1 wherein the display out of the first clock signal is output provided without rational clock division (RCD) of the first clock signal.

9. The method of claim 1 wherein the system is a sink that receives clock signals for decoding image data.

10. A system, comprising:
   a processor;
   a decoder communicatively coupled to the processor;
   at least one rational clock divider (RCD) logic to receive a first clock signal having a first frequency, wherein the first clock signal is output from the system in the form of a display out clock signal, and
   the rational clock divider (RCD) being configured to convert the first clock signal into a second clock signal, the second clock signal having a second frequency lower than the first frequency;
   at least one timer logic coupled to the RCD logic, the timer logic to generate at least one first video media timers using the second clock signal, and to generate at least one first video capture timestamps in response to the second clock signal,
   wherein the at least one first video media timers and the at least one first video capture timestamps are output from the system separately from the output of the first clock signal of the system so that the output of the at least one first video capture timestamps and the at least one first video media timers have a different frequency than the output first clock signal;
   the at least one rational clock divider (RCD) logic receiving a third clock signal having a third frequency;
   a divider to generate a fourth clock signal with a fourth frequency lower than the third frequency and in response to the third clock signal, the fourth clock signal being output from the system in the form of an audio out clock signal, and
   the at least one RCD logic being configured to generate a fifth clock signal in response to the third clock signal, the fifth clock signal having a fifth frequency, wherein the fifth frequency is lower than the third frequency; and
   the at least one timer logic coupled to the RCD logic, the timer logic to generate at least one first audio media timer using the fifth clock signal, and to generate at least one first audio capture timestamp in response to the fifth clock signal,
   wherein the at least one first audio media timer and the at least one first audio capture timestamp are output from the system separately from the output of the fourth clock signal from the system so that the output of the at least one first audio capture timestamp and the at least one first audio media timer have a different frequency than the output fourth clock signal.

11. The system of claim 10, wherein the second frequency has a value substantially equal to a value of the first frequency divided by a factor (M/N), wherein M and N comprise integers, and wherein M is greater than N.

12. The system of claim 10, further comprising:
   clock generator logic to provide the first clock signal.

13. The system of claim 10, further comprising:
   second timer logic coupled to the RCD logic, the second timer logic to generate one or more second media timers and one or more second capture timestamps in response to the second clock signal.

14. The system of claim 13, wherein the one or more first capture timestamps comprise video timestamps, and wherein the one or more second capture timestamps comprise audio timestamps.

15. At least one non-transitory computer readable medium having stored therein instructions that, if executed, result in:
   at a system having a decoder and a processor:
   receiving a first clock signal having a first frequency, and outputting the first clock signal from the system in the form of a display out clock signal;
   using rational clock divider (RCD) logic at the system to generate a second clock signal in response to the first clock signal, the second clock signal having a second frequency, wherein the second frequency is lower than the first frequency;
   generating at least one video media timers using the second clock signal; and
   generating at least one video capture timestamp in response to the second clock signal,
   wherein the at least one video media timers and the at least one video capture timestamp are output from the system separately from the output of the first clock signal of the system so that the output of the at least one video capture timestamp and the at least one video media timers have a different frequency than the output first clock signal;
   receiving a third clock signal having a third frequency;
   generating a fourth clock signal having a fourth frequency and in response to the third clock signal, wherein the fourth frequency is lower than the third frequency, and outputting the fourth clock signal from the system in the form of an audio out clock signal;
   using RCD logic at the system to generate a fifth clock signal in response to the third clock signal, the fifth clock signal having a fifth frequency, wherein the fifth frequency is lower than the third frequency;

generating audio media timers using the fifth clock signal; and generating at least one audio capture timestamp in response to the fifth clock signal, wherein the audio media timers and the at least one audio capture timestamp are output from the system separately from the output of the fourth clock signal of the system so that the output of the at least one audio capture timestamp and audio timers have a different frequency than the output fourth clock signal.

16. The computer readable medium of claim 15, wherein the second frequency has a value substantially equal to a value of the first frequency divided by a factor (M/N), wherein M and N comprise integers, and wherein M is greater than N.

17. The computer readable medium of claim 15, wherein using RCD logic to generate the second clock signal in response to the first clock signal comprises generating N pulses of the second clock in response to receiving M pulses of the first clock signal, wherein M and N comprise integers, and wherein M is greater than N.

18. The computer readable medium of claim 15, wherein instructions that, if executed, result in using RCD logic to generate the second clock signal in response to the first clock signal, further comprise instructions that, if executed, result in:

incrementing an error value by N in response to a pulse of the first clock signal; and generating a pulse of the second clock signal in response to the error value being greater than or equal to M, wherein N and M comprise integers, and wherein N is less than M.

19. The computer readable medium of claim 18, further comprising instructions that, if executed, result in:

decrementing the error value by M in response to generating a pulse of the second clock signal.

20. The computer readable medium of claim 15, wherein instructions that, if executed, result in using RCD logic to generate the second clock signal in response to the first clock signal do not include instructions that, if executed, result in using phase lock loop (PLL) logic to generate the second clock signal.

* * * * *